(12) United States Patent
Scott et al.

(10) Patent No.: US 12,375,064 B2
(45) Date of Patent: Jul. 29, 2025

(54) CONSOLIDATED ACOUSTIC TRANSFORMER IN TRANSMISSION CHAIN

(71) Applicant: Qorvo US, Inc., Greensboro, NC (US)

(72) Inventors: Baker Scott, San Jose, CA (US); Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 82 days.

(21) Appl. No.: 18/241,519

(22) Filed: Sep. 1, 2023

(65) Prior Publication Data

US 2024/0195391 A1 Jun. 13, 2024

Related U.S. Application Data

(63) Continuation-in-part of application No. 18/220,344, filed on Jul. 11, 2023.

(60) Provisional application No. 63/387,105, filed on Dec. 13, 2022.

(51) Int. Cl.
| H03H 9/00 | (2006.01) |
| H03H 9/52 | (2006.01) |
| H03H 9/64 | (2006.01) |
| H03H 9/70 | (2006.01) |
| H04B 10/50 | (2013.01) |

(52) U.S. Cl.
CPC .............. H03H 9/70 (2013.01); H03H 9/525 (2013.01); H03H 9/6483 (2013.01); H04B 10/50 (2013.01)

(58) Field of Classification Search
CPC ......... H03H 9/70; H03H 9/525; H03H 9/6483
See application file for complete search history.

(56) References Cited

U.S. PATENT DOCUMENTS

| 3,727,112 | A | 4/1973 | Popescu |
| 5,594,705 | A | 1/1997 | Connor et al. |
| 7,656,228 | B2 | 2/2010 | Fukuda et al. |
| 7,852,174 | B2 | 12/2010 | Cathelin et al. |
| 8,416,035 | B2 | 4/2013 | Fukuda et al. |
| 8,977,216 | B2 | 3/2015 | Weissman et al. |
| 10,951,248 | B1* | 3/2021 | Kamgaing ........... H04B 1/0075 |
| 2005/0206457 | A1* | 9/2005 | Martin .................... H03F 1/565 |
| | | | 330/305 |
| 2007/0178015 | A1* | 8/2007 | Schaedlich ........ G01N 33/0006 |
| | | | 422/562 |
| 2017/0126206 | A1 | 5/2017 | Nguyen et al. |
| 2020/0028489 | A1 | 1/2020 | Ta et al. |
| 2022/0239257 | A1* | 7/2022 | Hansen ............... H03F 3/45475 |

(Continued)

OTHER PUBLICATIONS

De Paco, P. et al., "Equivalent Circuit Modeling of Coupled Resonator Filters," IEEE Transactions on Ultrasonics, Ferroelectrics, and Frequency Control, vol. 55, No. 9, Sep. 2008, IEEE, pp. 2030-2037.

Primary Examiner — Tuan T Lam
(74) Attorney, Agent, or Firm — Withrow & Terranova, P.L.L.C.

(57) ABSTRACT

An acoustic transformer in a transmitter chain is disclosed. In one aspect, a differential power amplifier may produce a differential signal that is provided to an acoustic transformer coupled to an acoustic filter. The acoustic transformer provides a single-ended output signal for use by the acoustic filter. To facilitate operation in multiple bands, multiple acoustic transformer-acoustic filter pairs may be provided with a switching network used to route the amplified signal to the appropriate transformer-filter pair.

12 Claims, 17 Drawing Sheets

(56) References Cited

U.S. PATENT DOCUMENTS

| | | | |
|---|---|---|---|
| 2023/0299742 A1* | 9/2023 | Schmidhammer | H03H 9/542 345/418 |
| 2023/0299746 A1* | 9/2023 | Levesque | H03H 9/70 333/186 |
| 2023/0353117 A1* | 11/2023 | Schmidhammer | H03H 7/42 |
| 2024/0039515 A1* | 2/2024 | Takematsu | H04B 1/04 |
| 2024/0162923 A1* | 5/2024 | Tahara | H04B 1/0458 |
| 2024/0195381 A1* | 6/2024 | Lear | H03H 9/542 |

* cited by examiner

CONSOLIDATED ACOUSTIC TRANSFORMER IN TRANSMISSION CHAIN

PRIORITY CLAIM

The present application claims priority to U.S. Provisional Patent Application Ser. No. 63/387,105, filed on Dec. 13, 2022, and entitled "CONSOLIDATED ACOUSTIC TRANSFORMER IN TRANSMISSION CHAIN," the contents of which are incorporated herein by reference in its entirety.

The present application also claims priority to U.S. patent application Ser. No. 18/220,344, filed Jul. 11, 2023, and entitled "ACOUSTIC TRANSFORMER IN TRANSMISSION CHAIN," the contents of which are incorporated herein by reference in its entirety.

RELATED APPLICATIONS

The present application is related to U.S. Provisional Patent Application Ser. No. 63/406,800 filed on Sep. 15, 2022, and entitled "TUNABLE AND INCREASED OUT-OF-BAND ATTENUATION OF FIRST ACOUSTIC RESONATOR OF A LADDER," the contents of which are incorporated herein by reference in its entirety.

The present application is also related to U.S. Provisional Patent Application Ser. No. 63/387,101, filed on Dec. 13, 2022, and entitled "ACOUSTIC TRANSFORMER IN TRANSMISSION CHAIN," the contents of which are incorporated herein by reference in its entirety.

BACKGROUND

I. Field of the Disclosure

The technology of the disclosure relates generally to transmitter chains and, more particularly, to improving out-of-band rejection for filters in such transmitter chains.

II. Background

Computing devices abound in modern society, and more particularly, mobile communication devices have become increasingly common. The prevalence of these mobile communication devices is driven in part by the many functions that are now enabled on such devices. Increased processing capabilities in such devices means that mobile communication devices have evolved from pure communication tools into sophisticated mobile entertainment centers, thus enabling enhanced user experiences. With the advent of the myriad functions available to such devices, there has been increased pressure to find ways to improve performance of the transmission chains that are used to transmit data from the mobile computing device. One area that is ripe for innovation is improving the transformers and filters that are used between a power amplifier and an antenna. The related applications introduce structures to improve the filters, but leave room for improvement of the transformers.

SUMMARY

Aspects disclosed in the detailed description include a consolidated acoustic transformer in a transmission chain. In particular, a differential power amplifier may produce a differential signal that is provided to an acoustic transformer coupled to an acoustic filter. The acoustic transformer provides a single-ended output signal for use by the acoustic filter. To facilitate operation in multiple bands, multiple acoustic transformer-acoustic filter pairs may be provided with a switching network used to route the amplified signal to the appropriate transformer-filter pair. In contrast to earlier work by the owner of this disclosure, an extra transformer is eliminated, thereby reducing insertion loss and allowing greater flexibility in filter design.

In this regard in one aspect, a transmitter chain is disclosed. The transmitter chain comprises a power amplifier having a differential output comprising a first output line and a second output line. The transmitter chain also comprises an acoustic transformer directly coupled to the first output line and the second output line and comprising a single-ended output. The transmitter chain also comprises an acoustic filter comprising a tunable ferroelectric network element.

In another aspect, a transmitter chain is disclosed. The transmitter chain comprises a power amplifier having a differential output comprising a first output line and a second output line. The transmitter chain also comprises a first inductor coupled to the first output line and configured to be coupled to a supply bias voltage. The transmitter chain also comprises a second inductor coupled to the second output line and configured to be coupled to the supply voltage. The transmitter chain also comprises an acoustic transformer coupled to the first output line through a third inductor and coupled to the second output line through a fourth inductor and comprising a single-ended output. The transmitter chain also comprises an acoustic filter comprising a tunable ferroelectric network element.

In another aspect, a wireless communication device is disclosed. The wireless communication device includes a transmitter chain comprising a power amplifier having a differential output comprising a first output line and a second output line and an acoustic transformer directly coupled to the first output line and the second output line and comprising a single-ended output. The transmitter chain further comprises an acoustic filter comprising a tunable ferroelectric network element.

DETAILED DESCRIPTION

Figure 1:
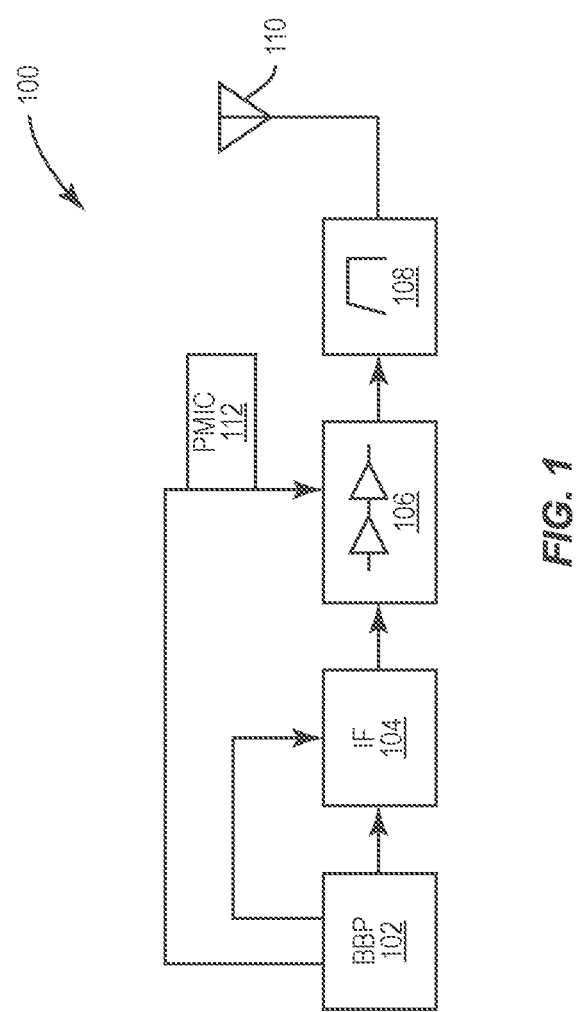
FIG. 1 is a block diagram of an exemplary transmitter that has a power amplifier and filter which may benefit from aspects of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a consolidated acoustic transformer in a transmission chain. In particular, a differential power amplifier may produce a differential signal that is provided to an acoustic transformer coupled to an acoustic filter. The acoustic transformer provides a single-ended output signal for use by the acoustic filter. To facilitate operation in multiple bands, multiple acoustic transformer-acoustic filter pairs may be provided with a switching network used to route the amplified signal to the appropriate transformer-filter pair. In contrast to earlier work by the owner of this disclosure, an extra transformer is eliminated, thereby reducing insertion loss and allowing greater flexibility in filter design.

FIGS. 1-12 relate to the concept of using an acoustic transformer with an acoustic filter to improve out-of-band rejection for a differential signal. This improvement allows requirements on the filter to be relaxed. Further aspects discussed in these figures relate to being able to tune the filters with negative capacitance elements using ferroelectric resonators. A discussion of improvements to this system and expansion to multi-band functionality begins below with reference to FIG. 13.

In this regard, FIG. 1 is a block diagram of a transmitter chain 100 that may be used in a mobile computing device. Signals to be transmitted are processed in a baseband processor (BBP) 102 and passed to an optional intermediate frequency (IF) processor 104 for upconversion and/or filtering. A radio frequency (RF) signal is created either by the BBP 102 or the IF processor 104 and provided to an amplifier chain 106, which amplifies the signal to a desired level before filtering in an RF filter 108 and transmission from an antenna 110. A power management integrated circuit (PMIC) 112 may receive information from the BBP 102 to assist in controlling the amplifier chain 106.

As the cellular and other wireless standards evolve, there has been increased pressure to provide proper amplification and proper filtering of the RF signals to be transmitted. The RF filtering is used to help achieve coexistence with other radios and with other RF frequencies as well as general compliance with applicable wireless protocol standards. In particular, the RF filtering is designed to provide strong out-of-band rejection. Typical implementations trade out-of-band rejection (i.e., the desired filtering) with in-band insertion losses and may consume extra current. Further, in many instances the amplifier chain 106 has a low impedance, but the antenna/air interface may have a comparatively high impedance. This impedance mismatch may create reflections at the antenna, and accordingly, there are circuits in the transmitter chain 100 to assist in impedance matching. Thus, providing desired RF filtering has proven challenging to implement.

Exemplary aspects of the present disclosure provide two ways to improve implementation of the impedance matching and filtering. In a first aspect, an acoustic transformer is added in front of an acoustic filter. Having both structures made from similar acoustic technologies simplifies construction of the overall device. Further, the use of an acoustic transformer may assist in impedance matching and changing from a differential signal to a single-ended signal. The use of such an acoustic transformer also assists in out-of-band cancellation, which allows greater flexibility in construction of the filter. In a second aspect, ferroelectric materials in the acoustic filter may be used to assist in tuning the acoustic filter with a negative capacitance element to allow greater flexibility in the design of the filter. A discussion of the first aspect is presented below with reference to FIGS. 2-7, and a discussion of the second aspect begins below with reference to FIG. 8.

Figure 2:
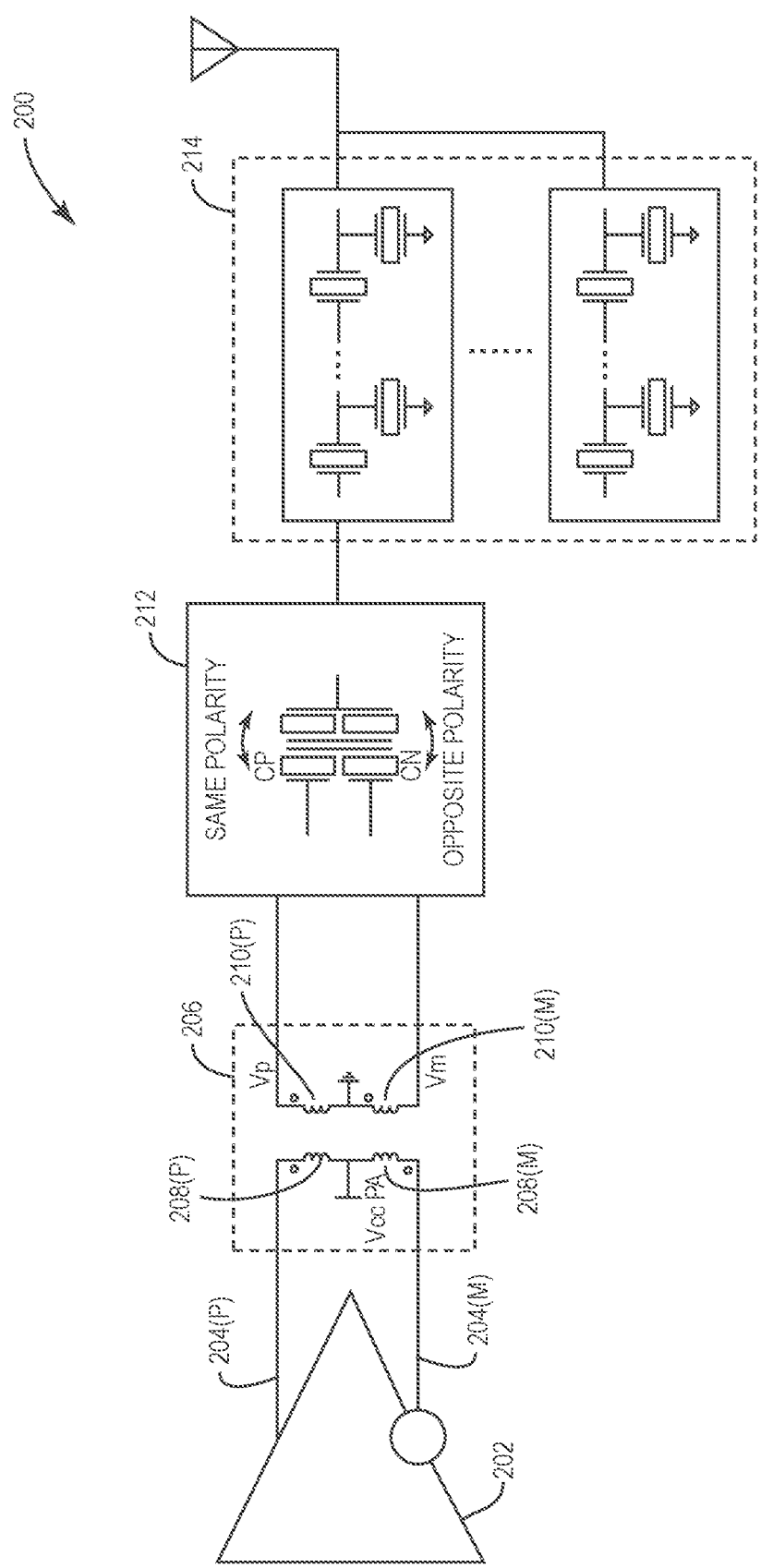
FIG. 2 is a block diagram of a first aspect of the present disclosure where a broadband differential transformer is cascaded with a narrowband acoustic transformer to assist in out-of-band rejection for an acoustic filter.

In this regard, FIG. 2 illustrates a portion 200 of a transmitter chain that may be part of the transmitter chain 100 of FIG. 1. The portion 200 includes a differential power amplifier 202 (e.g., a final amplifier in the amplifier chain 106 of FIG. 1) having output lines 204(P) and 204(M). The signals on these output lines 204(P) and 204(M) may be considered broadband differential outputs. The output lines 204(P) and 204(M) are coupled to a first transformer 206 having primary coils 208(P) and 208(M) and secondary coils 210(P) and 210(M). The first transformer 206 is coupled to a second or acoustic transformer 212. As such, the acoustic transformer 212 may include a first resonator that compresses when a positive voltage is applied (CP) and a second resonator that compresses when a negative voltage is applied (CN). The acoustic transformer 212 is then coupled to an acoustic ladder filter 214. In exemplary aspect, the acoustic ladder filter 214 is a reduced order ladder filter. Because the acoustic transformer 212 and the acoustic ladder filter 214 may be formed from the same technologies, they may be implemented in a single acoustic die.

Figure 3:
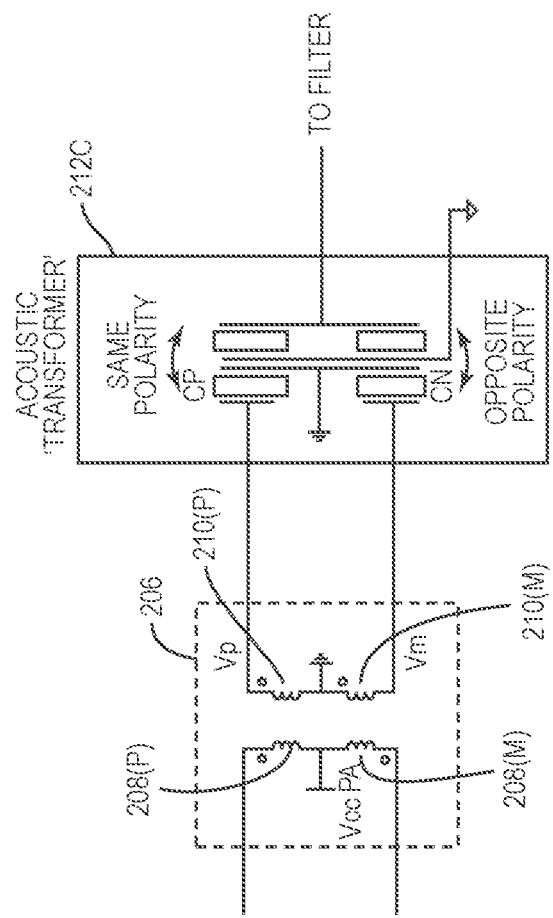
FIG. 3 is a block diagram of the acoustic transformer of FIG. 2 that uses current summing to provide a single-ended output.

In a first aspect, the acoustic transformer 212 may sum currents at the output with one branch using opposite polarity of coupled resonators as better illustrated as acoustic transformer 212C in FIG. 3. To do this, the CP resonator of the acoustic transformer 212C may have the same polarity and the CN resonator of the acoustic transformer 212C may have opposite polarity.

Figure 4:
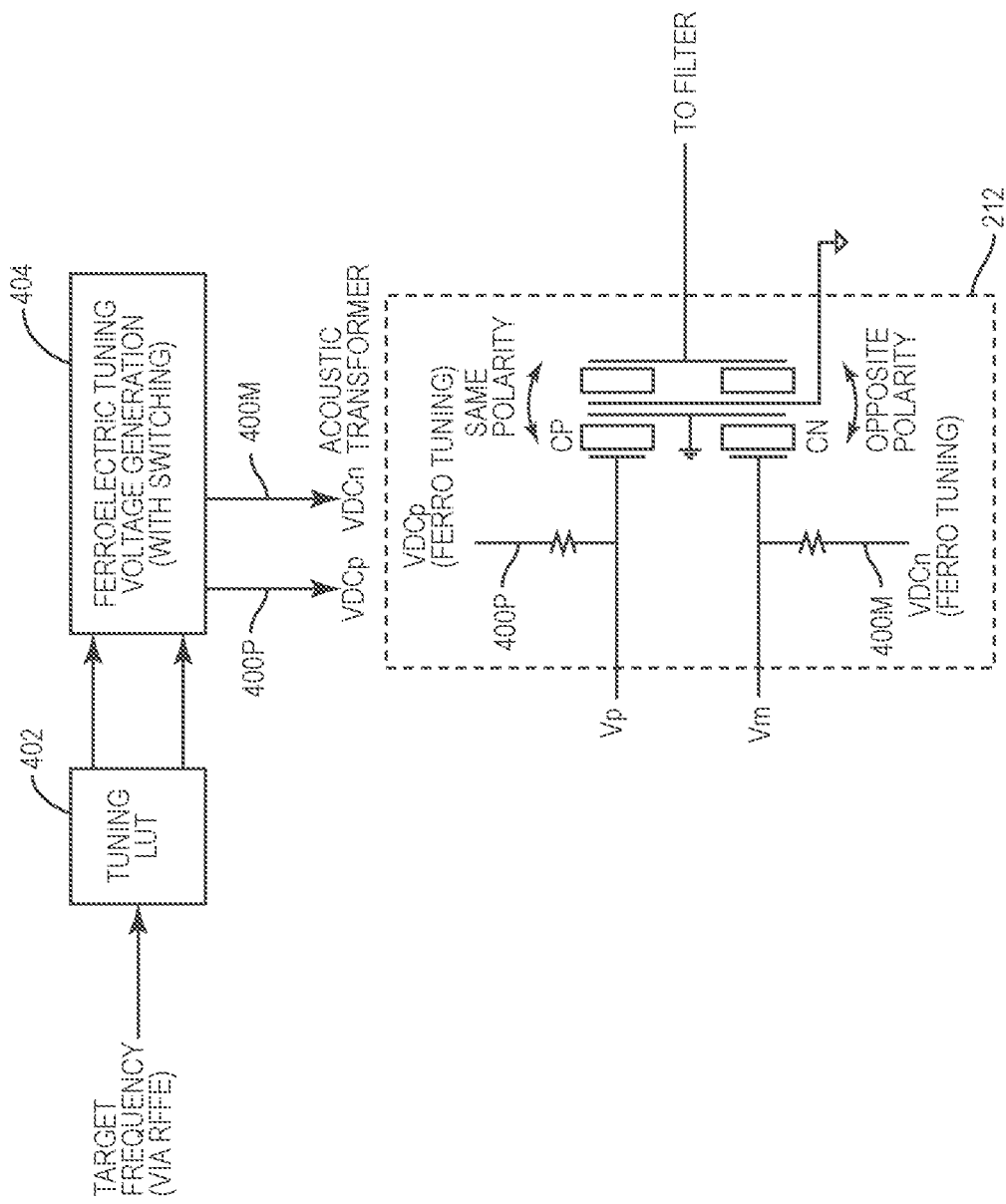
FIG. 4 is a block diagram of the acoustic transformer of FIG. 3 with ferroelectric tuning used to improve cancelation of out-of-band signals.

Note further that the acoustic differential may be tuned through the use of ferroelectric resonators whose polarity may be adjusted via applying an external direct current (DC) supply as better illustrated in FIG. 4. A separate voltage 400P and 400M may be applied to the different branches of the acoustic transformer 212 (regardless of whether the transformer is a current summing transformer 212C or a voltage summing transformer 212V discussed with reference to FIG. 6 below). The tuning may be done by selecting the voltage 400P and 400M by reference to a look-up table (LUT) 402 and a generation circuit 404. The LUT 402 may use a target frequency as an input to determine desired voltage levels. After tuning, the voltages 400P and 400M may be removed.

Figure 5:
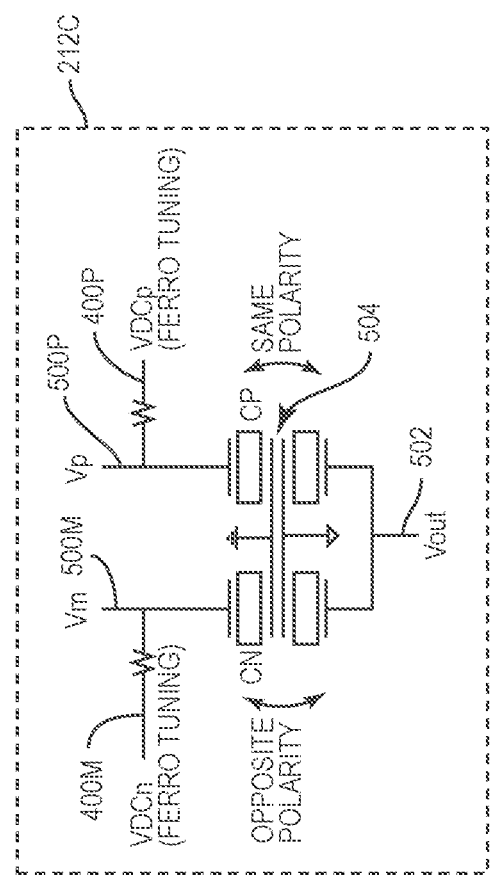
FIG. 5 is a more detailed diagram of the acoustic transformer of FIG. 3 showing differential to single-ended current output.

An example structure showing how the differential input signal is converted to a single-ended output signal is provided with reference to FIG. 5. Specifically, inputs 500M and 500P are provided to the acoustic transformer 212C, which sums the current on each branch to provide a single-ended output signal at output 502. A coupling layer 504 may be provided.

It should be appreciated that the acoustic transformer 212 is relatively narrow band. When cascaded with the broadband first transformer 206, the in-band desired signal will see two inversions in sign and thus will add up, while out-of-band signals will see a single inversion in sign. This results in cancelation of the out-of-band signals, which in turn enhances out-of-band rejection of the acoustic ladder filter 214.

Figure 6:
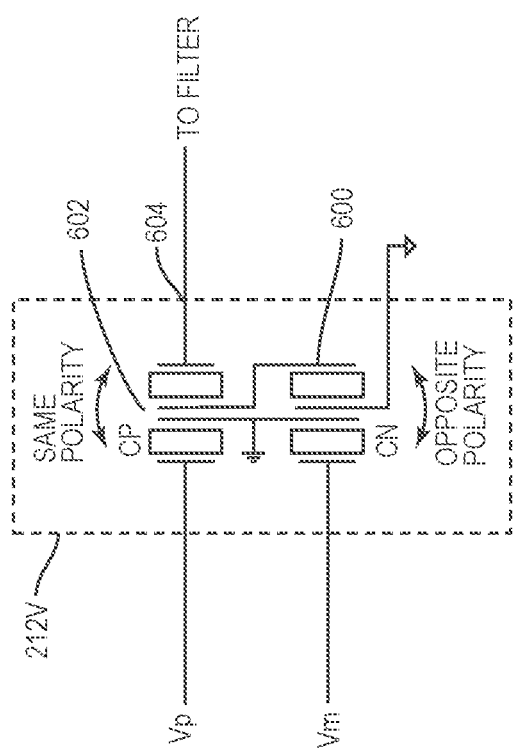
FIG. 6 is a block diagram of the acoustic transformer of FIG. 2 that uses voltage summing to provide a single-ended output.
Figure 7:
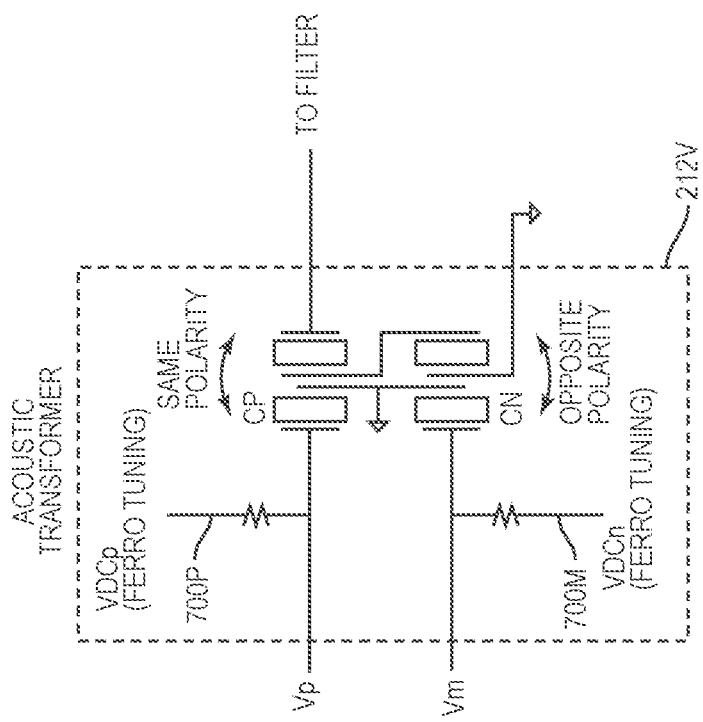
FIG. 7 is a block diagram of the acoustic transformer of FIG. 6 with ferroelectric tuning used to improve cancelation of out-of-band signals.

Instead of summing current, it is also possible to make an acoustic transformer that sums voltage as better seen in FIG. 6. Here, an output 600 of the negative branch is added to a coupling layer 602 of the positive branch to provide a unified (summed voltage) output 604. The same sort of ferroelectric tuning may be done as better illustrated in FIG. 7, where voltages 700P and 700M may be used to tune ferroelectric elements within the acoustic transformer 212V.

Figure 8:
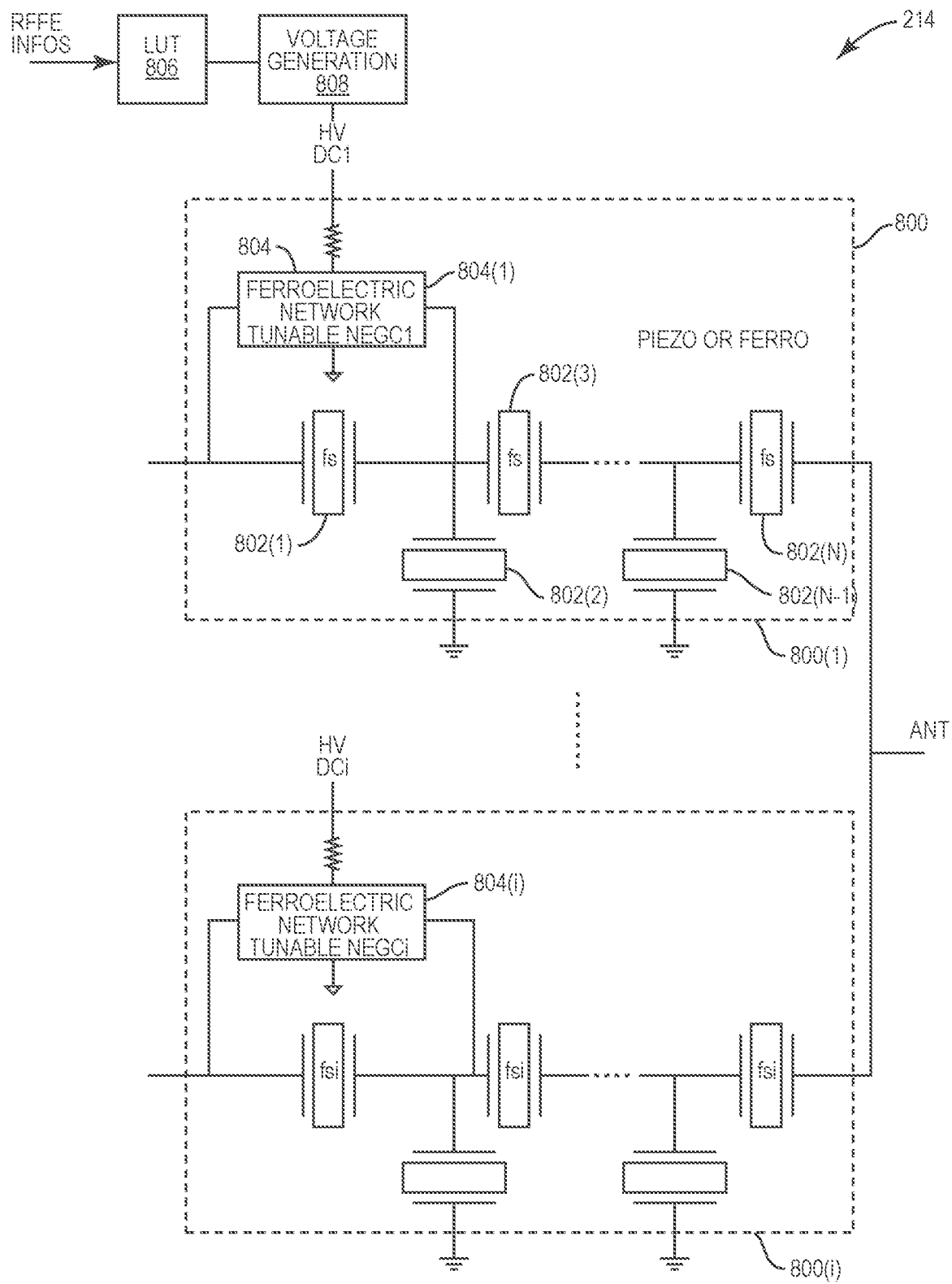
FIG. 8 is a block diagram of an acoustic filter that uses ferroelectric tuning with negative capacitance to assist in filter formation according to an exemplary aspect of the present disclosure.

In addition to providing cancelation in the acoustic transformer 212 to improve out-of-band rejection, exemplary aspects of the present disclosure also add a tunable negative capacitance element to the acoustic ladder filter 214. In this regard, FIG. 8 illustrates a high-level diagram of this concept. In particular, the acoustic ladder filter 214 may include ladder elements 800(1)-800(i). Each ladder element 800 includes resonant sub-elements 802(1)-802(N) that may be or act as reactive elements such as inductors or capacitors as is well understood. Exemplary aspects of the present disclosure add tunable ferroelectric network elements 804(1)-804(i) to one or more of the sub-elements 802(1)-802(N) (as shown, applied in parallel to the sub-element 802(1)). The ferroelectric network elements 804(1)-804(i) are independently tunable by application of a voltage level determined by a LUT 806 and voltage generation circuit 808. Information about the signal being transmitted (e.g., from the BBP 102 or other source) may be used to select values from the LUT 806.

Figure 9:
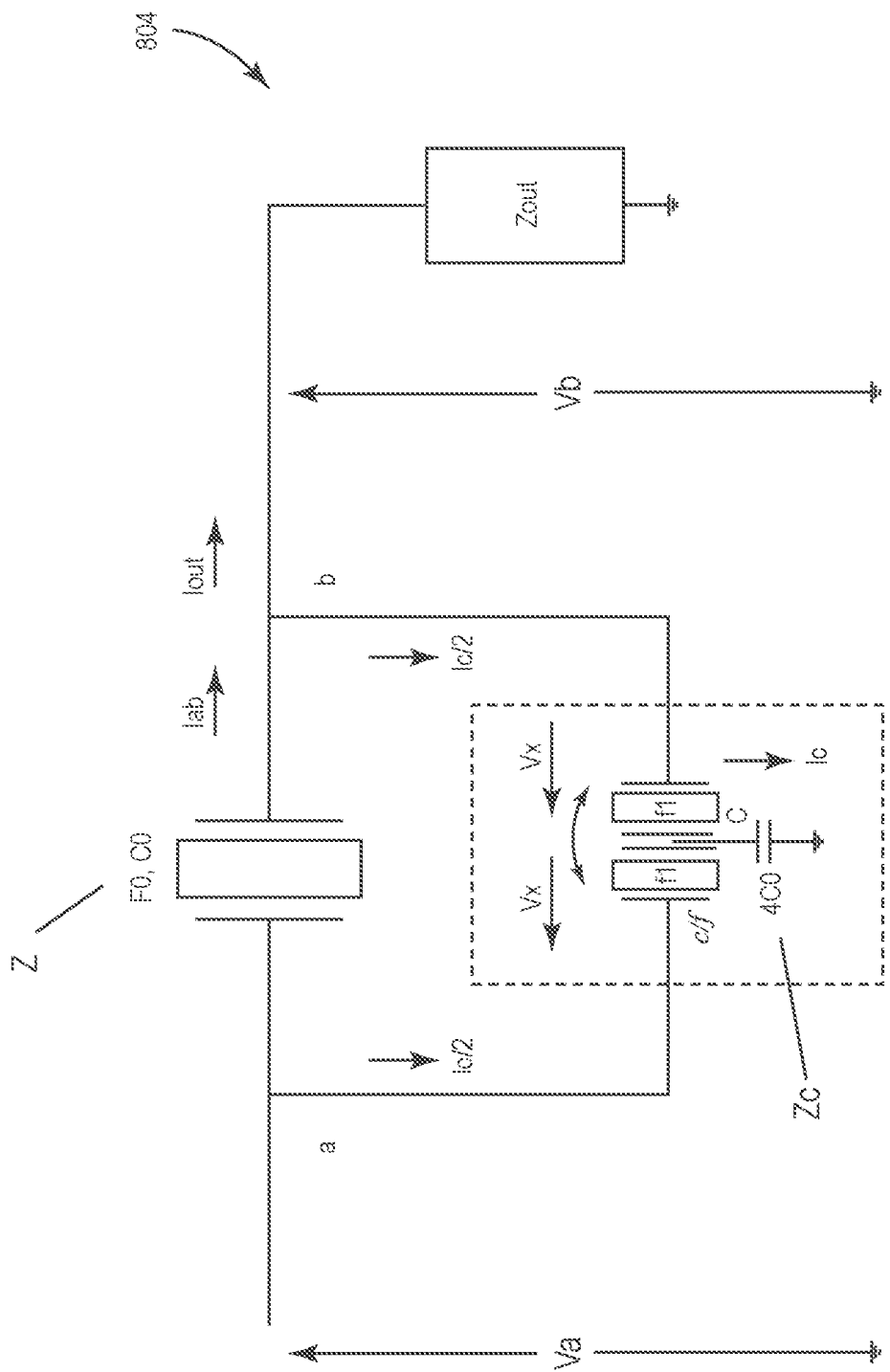
FIG. 9 is a more detailed circuit diagram of the ferroelectric tuning of the acoustic filter of FIG. 8.

The ferroelectric network elements 804(1)-804(i) may be a negative capacitance. With reference to FIG. 9, the math for the negative capacitance is provided. Specifically:

$$Vab = Vac + Vcb$$

$$Vac = Vcb = Vx \text{ due to the transformer coupling}$$

$$2Vx = Vab \text{ or } Vx = \frac{Vab}{2}$$

$$Ic = \frac{Vc}{Zc}$$

$$Vb = Zout * Iout = Zout * \left(Iab - \frac{Ic}{2}\right)$$

$$Iab = \frac{Va - Vb}{Z}$$

-continued $$Vb = Zout * \left\{\frac{Va - Vb}{Z} - \frac{Vc}{2Zc}\right\} = Zout * \left\{\frac{Va - Vb}{Z} - \frac{Va + Vb}{4Zc}\right\}$$

$$Vb = Va * Zout * \frac{\frac{1}{Z} - \frac{1}{4Zc}}{1 + \frac{Zout}{Z} + \frac{Zout}{4Zc}}$$

Vb can be zero when Zc=Z/4, since Z≈1/Coω at out-of-band frequencies, so Zc will be 1/4Coω and the middle capacitance is 4Co to get an ideal negative Co cancelation at out-of-band frequencies. This shows that it is possible to cancel RF current and make Vb=0 if 4Zc=Z in the frequencies of interest. Thus, if Zc=Z/4 with Zc, the impedance of the capacitance to ground network and Z is the impedance of the series acoustic resonator.

Figure 10:
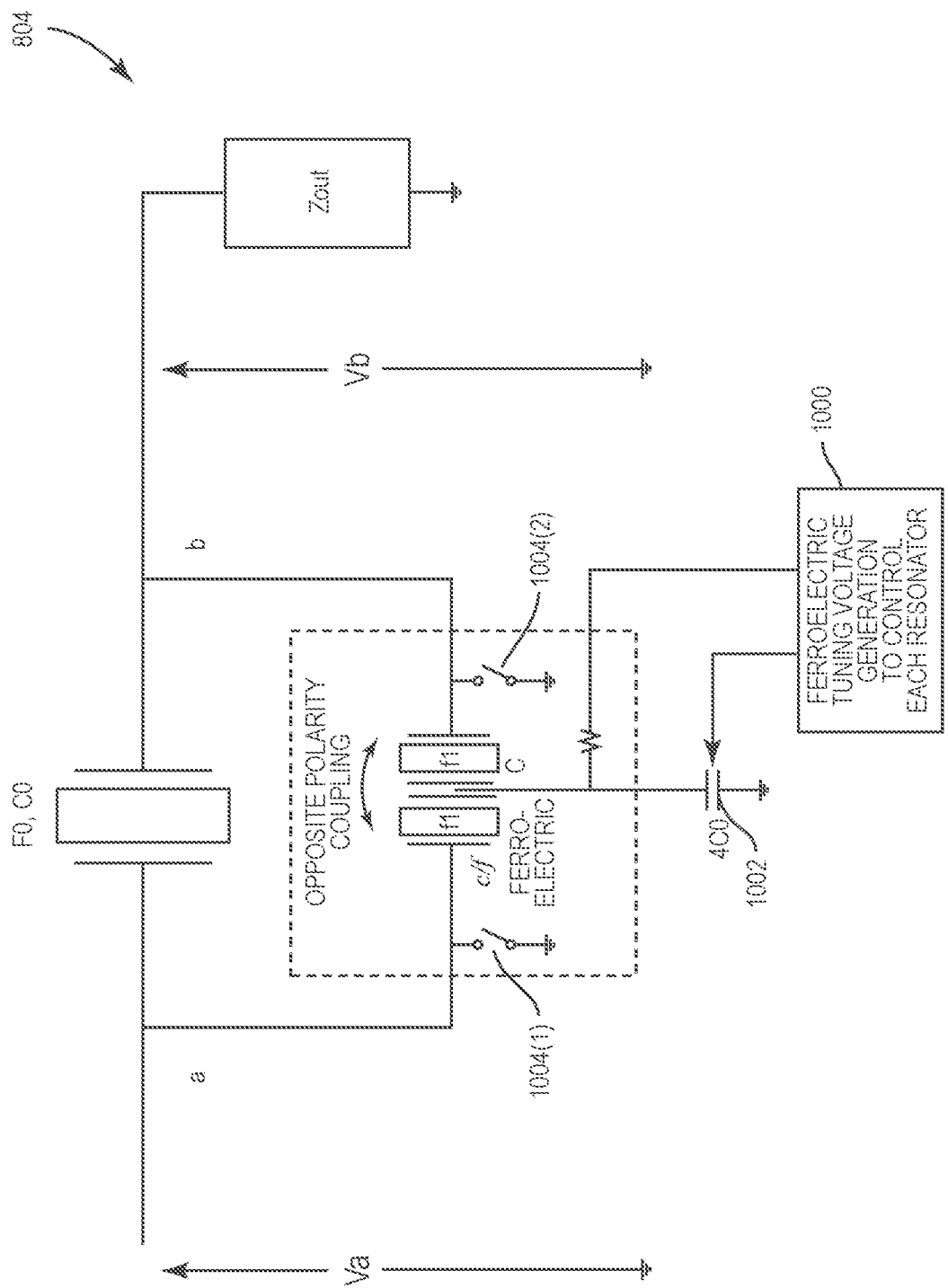
FIG. 10 is a block diagram of a voltage source being used to tune the ferroelectric elements of the acoustic filter of FIG. 8.
Figure 11:
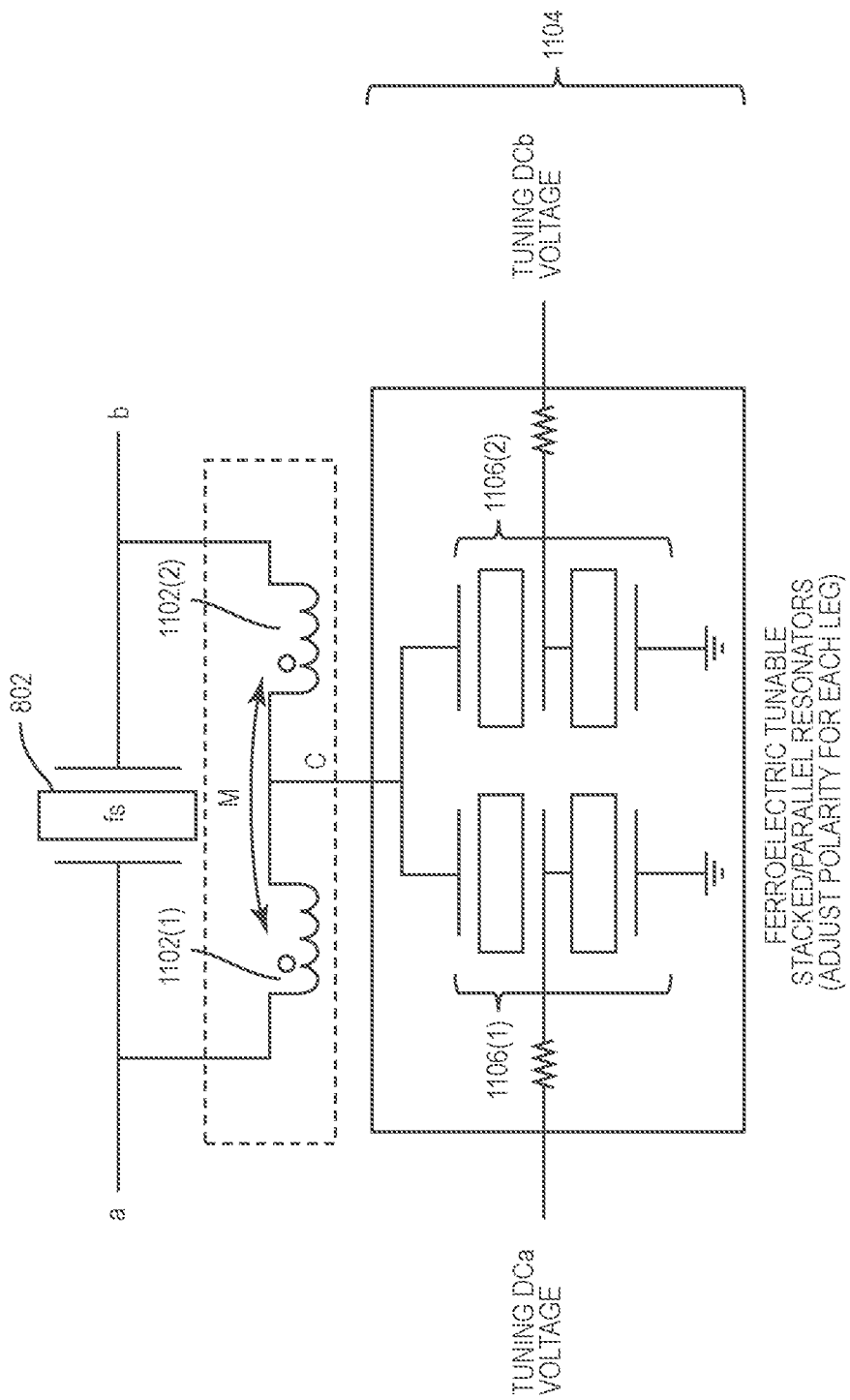
FIG. 11 is a circuit diagram of an alternate aspect of an acoustic filter according to an exemplary aspect of the present disclosure.

Implementing this math may look like the circuit illustrated in FIG. 10 where a voltage generation source 1000 (e.g., analogous to the voltage generation circuit 808 of FIG. 8) applies a tuning voltage to control each resonator and capacitor 1002. Switches 1004(1), 1004(2) may be used to apply tuning voltages from the voltage generation source 1000 as needed.

Where it is not possible to use two negatively-coupled acoustic resonators, two negatively-coupled inductors could be used as illustrated in FIG. 11. Specifically, a sub-element 802 may have two inductors 1102(1), 1102(2) that are negatively coupled. A shunt path 1104 may be formed that couples the midpoint to ground through two parallel acoustic branches 1106(1), 1106(2) each with a dedicated tuning voltage DCa, DCb.

This structure in FIG. 11 allows deactivation of one branch 1106(1), 1106(2) at a time (or both), or tune one branch 1106(1), 1106(2) series resonance or equivalent capacitance or tune such that both have similar series resonances with a constant sum capacitance. This topology offers great flexibility to tune the impedance Zc such that Zc≈Z/4 for the frequency of desired cancelation.

Figure 12:
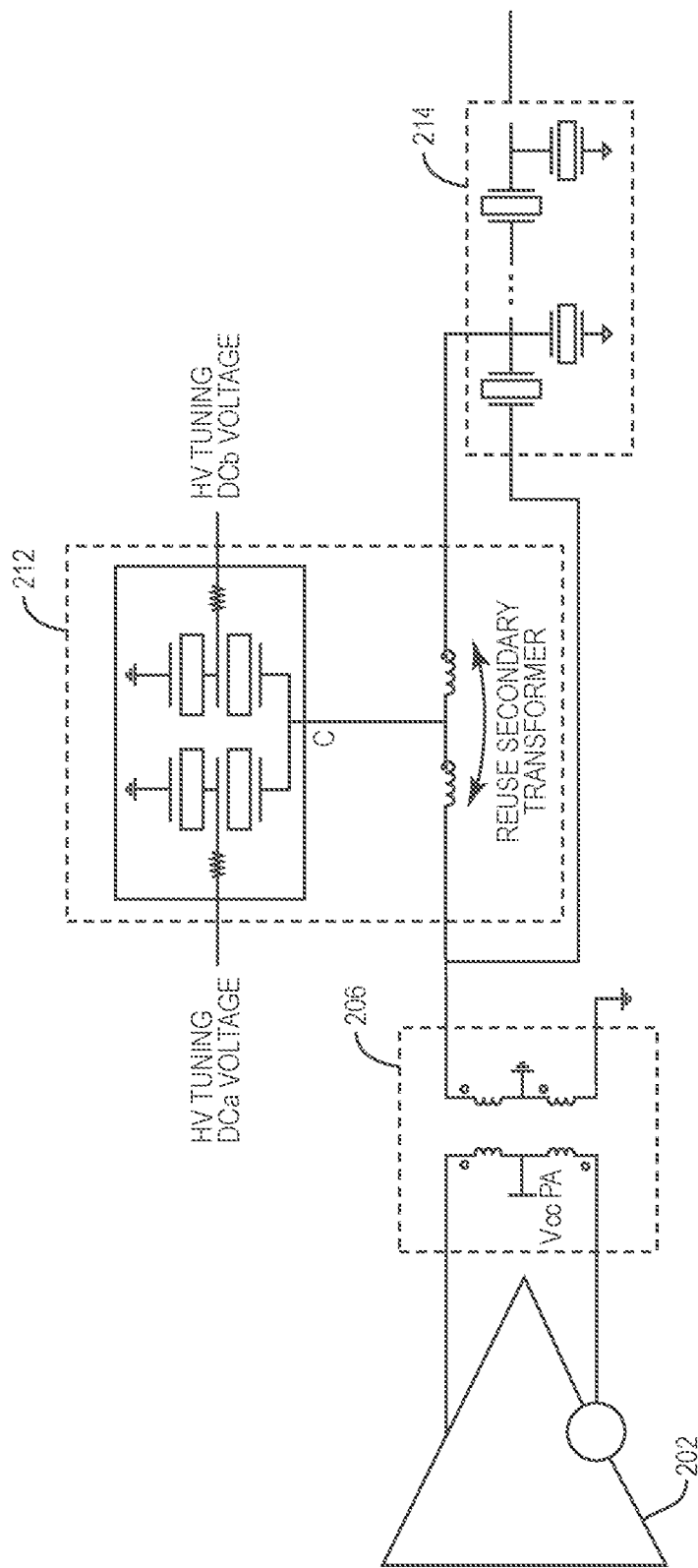
FIG. 12 is a circuit diagram of a transmitter chain with an alternate aspect of the secondary transformer.

It may also be possible to use this structure as part of the second transformer 212 where the shunt path is coupled to a common node between the inductors as illustrated in FIG. 12.

In contrast to the aspects disclosed in FIGS. 1-12, the focus of the present disclosure is the reduction or elimination of the first transformer 206. This may result in space savings through the elimination of one or more inductors or at least reducing the size of one or more inductors. Further aspects of the present disclosure contemplate using multiple acoustic transformer-acoustic filter pairs for multi-band operation with a broadband power amplifier. The acoustic transformer may also provide impedance transformation to a higher impedance. The elimination or reduction of the inductors will also lower overall insertion loss.

Figure 13:
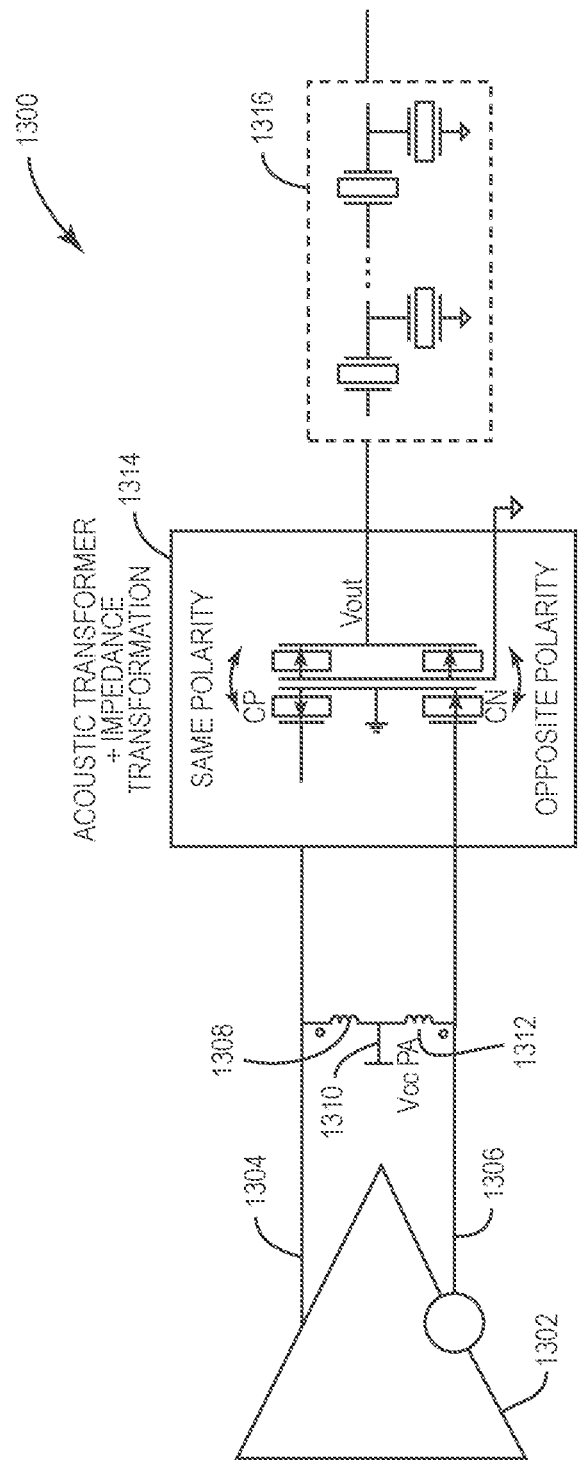
FIG. 13 is a block diagram of a consolidated acoustic transformer that eliminates the first transformer of the system of FIG. 2.

In this regard, FIG. 13 illustrates a transmission chain 1300 with a differential power amplifier 1302. While not shown, it should be appreciated that the differential power amplifier 1302 may have internal transistors, and more specifically, a collector of at least one such internal transistor provides an output line 1304 and a collector of another such internal transistor provides an output line 1306. A first inductor 1308 couples the output line 1304 to a supply bias voltage 1310 (e.g., from an envelope tracking or average power tracking circuit), and a second inductor 1312 couples the output line 1306 to the supply bias voltage 1310. The output lines 1304, 1306 also directly couple to an acoustic transformer 1314, which raises the impedance and converts the differential signal to a single-ended signal. The single-ended signal is provided to an acoustic ladder filter 1316. The acoustic transformer 1314 may be a current summing transformer such as the acoustic transformer 212C (of FIG. 3) or a voltage summing transformer such as the acoustic transformer 212V (shown in FIG. 6, but not shown in FIG. 13).

For the purposes herein, "directly" means either a direct connection such as shown in FIG. 13 or with a switch therebetween such as described in FIG. 14 below. Specifically excluded from this definition of "directly" is a situation where an inductor is placed in series between the output of the differential power amplifier 1302 and the input of the acoustic transformer 1314.

The structure of FIG. 13, and specifically, the acoustic transformer 1314 and acoustic ladder filter 1316, are relatively narrowband, particularly as compared to the differential power amplifier 1302. As such, a given pair may not be able to filter appropriately all the signals of interest. That is, a given pair may have a passband allowing signals at a frequency range of interest to pass, but rejecting other signals that are not at that specific range. Accordingly, multiple pairs may be used, with each narrowband pair operating at a frequency range of interest as better seen in FIG. 14 (i.e., having different passbands from other pairs).

Figure 14:
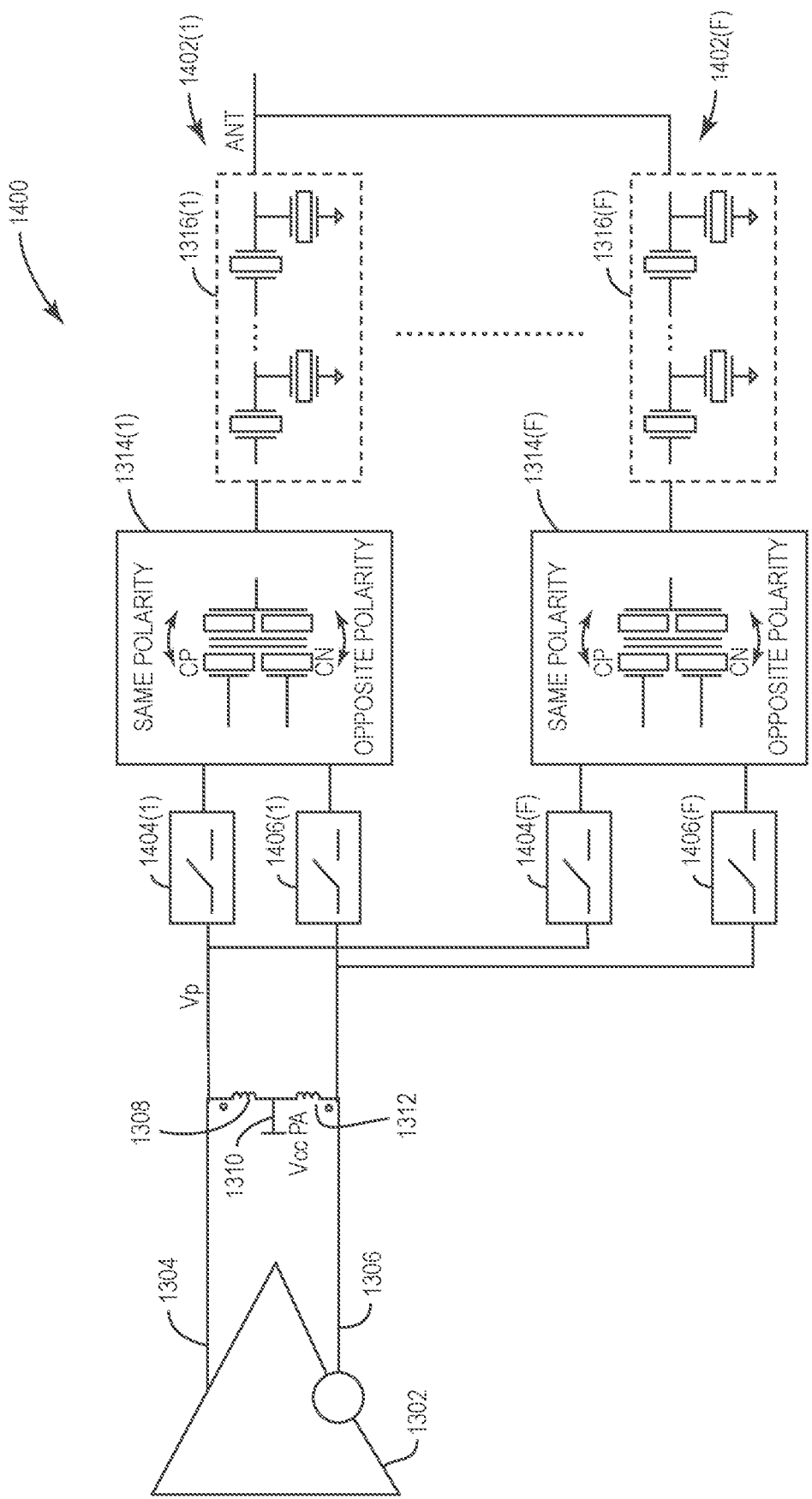
FIG. 14 is a block diagram of a multi-band transmission chain with a switching network to couple a power amplifier to one of an array of transformer-filter pairs.

In this regard, FIG. 14 illustrates a transmission chain 1400 with the differential power amplifier 1302, inductors 1308, 1312, and a plurality of transformer-filter pairs 1402(1)-1402(F) each having a respective acoustic transformer 1314(1)-1314(F) and a respective acoustic ladder filter 1316(1)-1316(F). Each of the transformer-filter pairs 1402(1)-1402(F) has a pair of switches 1404(1)-1404(F), 1406(1)-1406(F) coupled to the output lines 1304, 1306, respectively. Thus, per the definition of "directly" provided above, the transformer-filter pairs are still directly coupled to the output lines. In an exemplary aspect, the switches 1404(1)-1404(F), 1406(1)-1406(F) are half-band microelectromechanical systems (MEMS) switches. Use of MEMS switches allows for better overall Figure of Merit (FOM) and may also allow for a lower effective resistance (i.e., having multiple switches in parallel). The half-band is possible since half the band will be on the positive RF side and half on the negative side. This further allows each switch to handle half the power. This reduced power handling allows for smaller devices, which saves power and space. The reduced resistance is desirable since the differential power amplifier 1302 has a low impedance and since the transformation from differential to single-ended signals happens after the switches.

Figure 15:
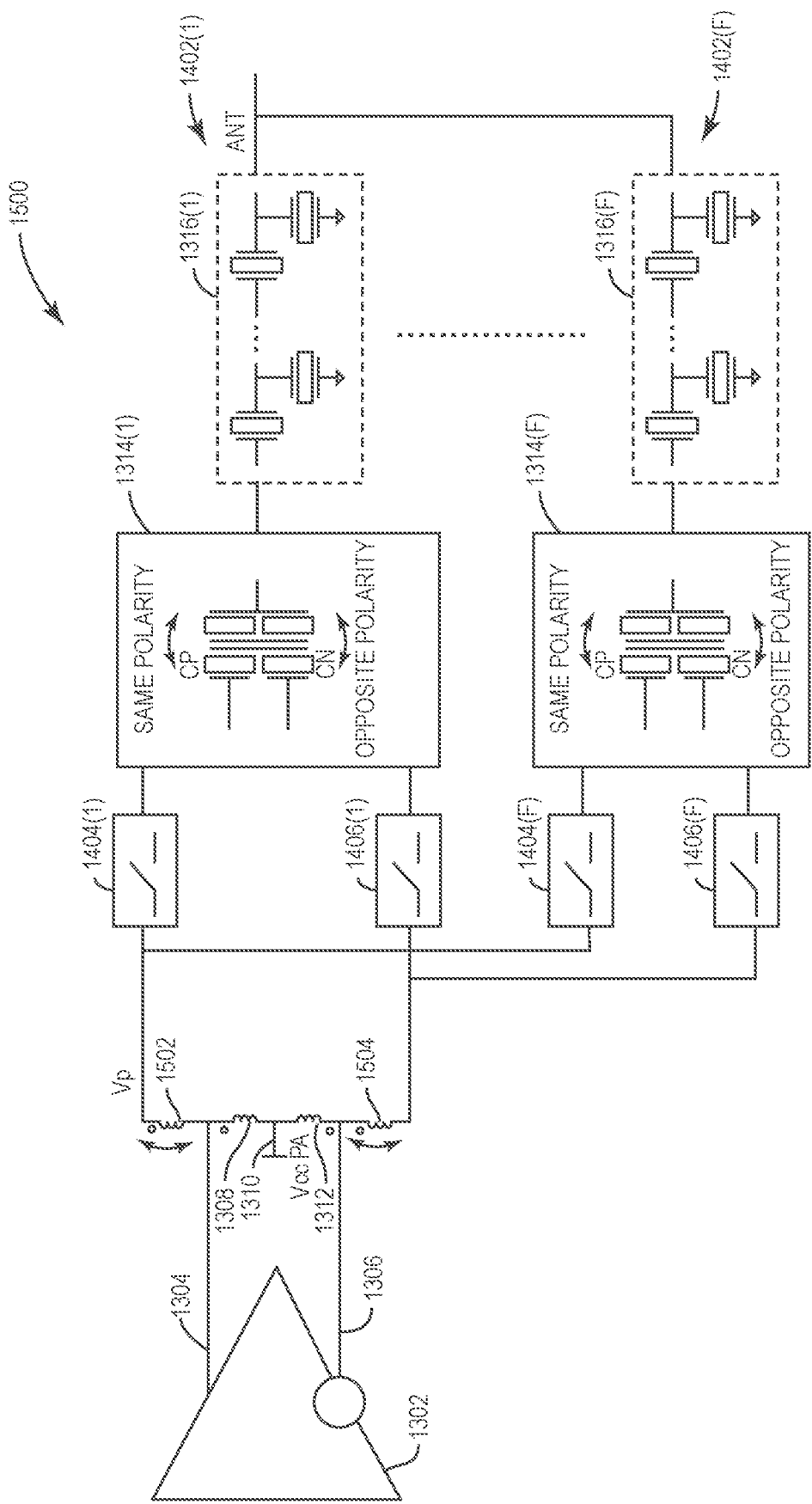
FIG. 15 is a block diagram of the multi-band transmission chain of FIG. 14 with coupled inductors in each branch of the differential path.

While the structures of FIGS. 13 and 14 eliminate the first transformer 206, reducing to just paired inductors 1308, 1312, the present disclosure also contemplates reintroducing unbalanced first transformers as better seen in FIG. 15. In this regard, FIG. 15 illustrates a transmission chain 1500 that adds inductors 1502, 1504 between the output lines 1304, 1306 and the transformer-filter pairs 1402(1)-1402(F). The inductors 1502, 1504 will be coupled to the inductors 1308, 1312, respectively, and result in a higher transformation ratio. This higher transformation ratio increases the output impedance of the differential power amplifier 1302 without necessarily going to a full transformer 206.

Figure 16:
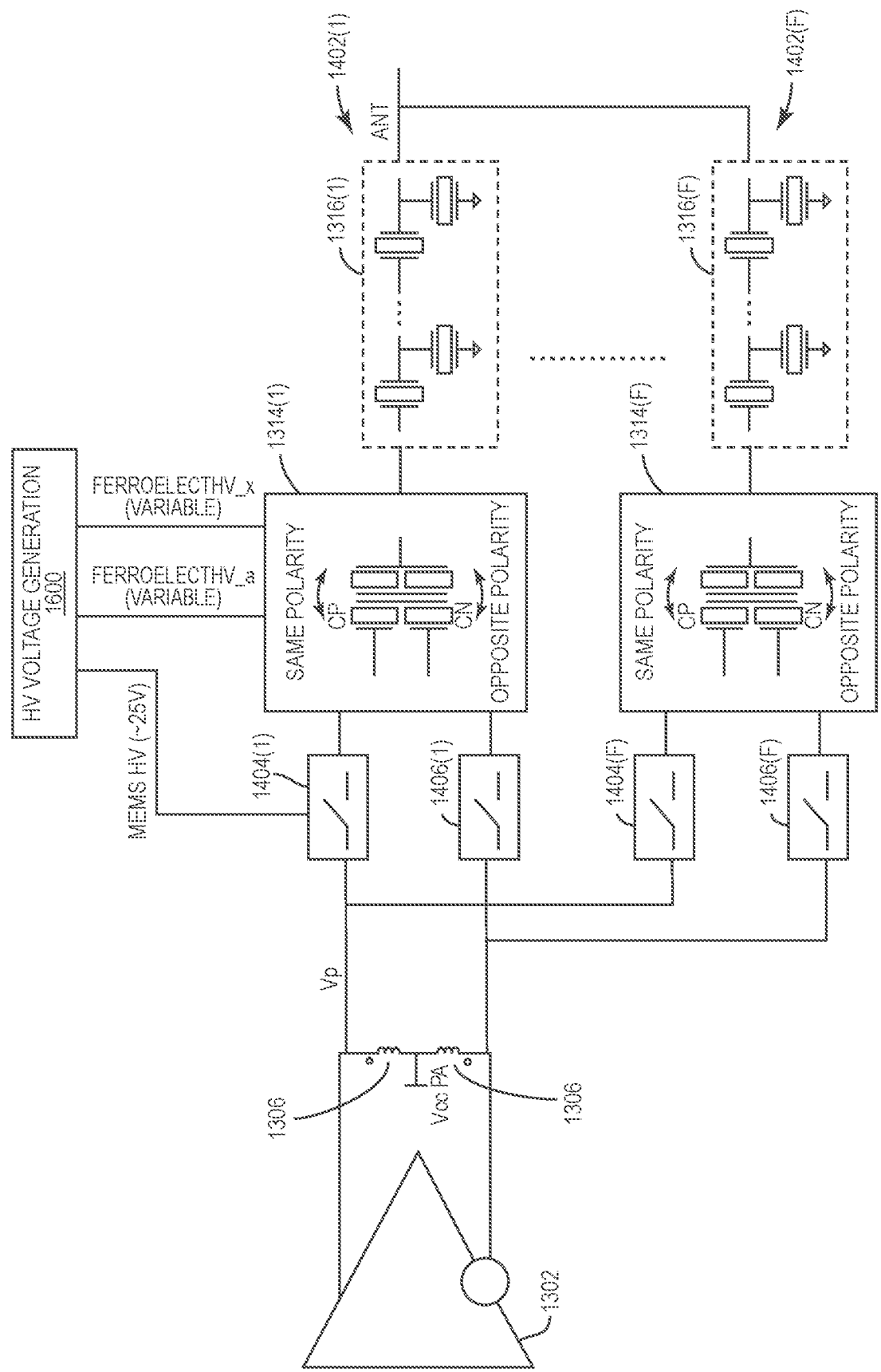
FIG. 16 is a block diagram of a voltage source being selectively applied to the multi-band pairs to tune ferroelectric elements therewithin.

It should also be appreciated that for any of the multi-band aspects, the acoustic resonators are tunable, particularly in the acoustic transformers. Accordingly, a single voltage generation circuit 1600 may be provided that supplies voltage to both the MEMS switches and the resonators as shown in FIG. 16.

Figure 17:
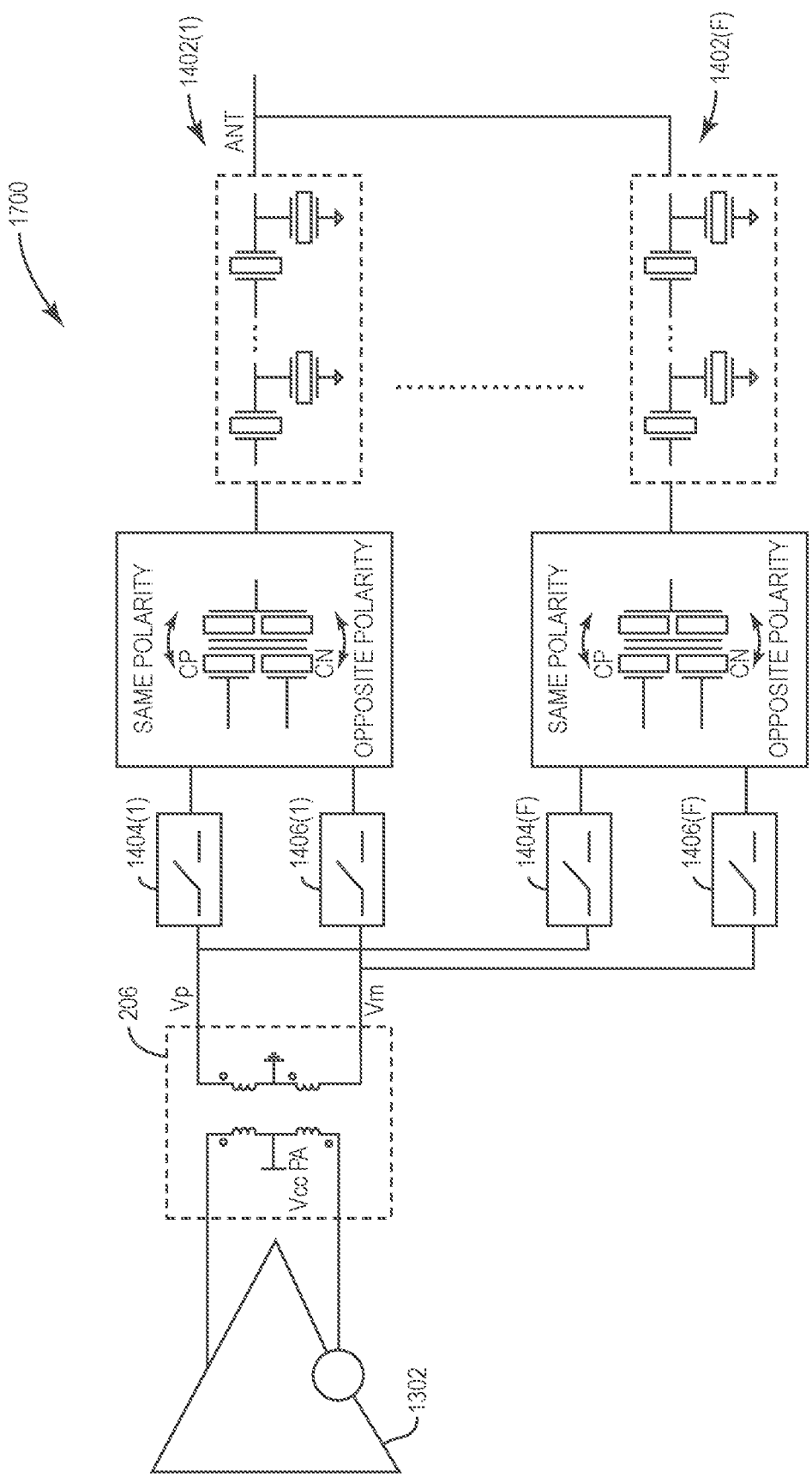
FIG. 17 shows how the transmission chain of FIG. 2 may be expanded to multi-band transformer-filter pairs.

As a further aspect, it may be possible to put the MEMS switches 1404(1)-1404(F), 1406(1)-1406(F) into a system 1700 that includes a full transformer 206 as better seen in FIG. 17.

While not specifically referenced after FIG. 1, it should be appreciated that any of the aspects disclosed herein may be used in a wireless communication device such as a mobile computing device, a smartphone, a tablet, a base station, or the like.

Likewise, while not presented as a separate flowchart, there are processes of using the present disclosure. In particular, a power amplifier may output a differential output; an acoustic transformer directly coupled to the power amplifier may generate a single-ended output from the differential output; and acoustic filter comprising a tunable ferroelectric network element may filter the single-ended output.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

What is claimed is:

1. A transmitter chain comprising:
   a power amplifier having a differential output comprising a first output line and a second output line;
   an acoustic transformer directly coupled to the first output line and the second output line and comprising a single-ended output; and
   an acoustic filter comprising a tunable ferroelectric network element.

2. The transmitter chain of claim 1, wherein the acoustic transformer is configured to sum currents for the single-ended output.

3. The transmitter chain of claim 1, wherein the acoustic transformer is configured to sum voltages for the single-ended output.

4. The transmitter chain of claim 1, wherein the acoustic transformer is configured to provide out-of-band cancelation.

5. The transmitter chain of claim 1, wherein the acoustic filter comprises a ladder filter.

6. The transmitter chain of claim 1, further comprising a first inductor coupling the first output line to a supply bias voltage and a second inductor coupling the second output line to the supply bias voltage.

7. The transmitter chain of claim 1, further comprising a pair of switches positioned between the output lines and the acoustic transformer.

8. The transmitter chain of claim 7, further comprising a second acoustic transformer and a second acoustic filter coupled to the second acoustic transformer, the second acoustic transformer switchably coupled to the first output line and the second output line through a second pair of switches.

9. The transmitter chain of claim 8, wherein the second acoustic filter is configured to provide a passband for a frequency range different than a passband of the acoustic filter.

10. The transmitter chain of claim 7, wherein the pair of switches comprises microelectromechanical system (MEMS) switches.

11. A transmitter chain comprising:
    a power amplifier having a differential output comprising a first output line and a second output line;
    a first inductor coupled to the first output line and configured to be coupled to a supply bias voltage;
    a second inductor coupled to the second output line and configured to be coupled to the supply voltage;
    an acoustic transformer coupled to the first output line through a third inductor and coupled to the second output line through a fourth inductor and comprising a single-ended output; and
    an acoustic filter comprising a tunable ferroelectric network element.

12. A wireless communication device comprising:
    a transmitter chain comprising:
      a power amplifier having a differential output comprising a first output line and a second output line;
      an acoustic transformer directly coupled to the first output line and the second output line and comprising a single-ended output; and
      an acoustic filter comprising a tunable ferroelectric network element.

* * * * *